(12) United States Patent
Hemker et al.

(10) Patent No.: US 7,045,019 B1
(45) Date of Patent: May 16, 2006

(54) METHOD FOR PERFORMING SITE-SPECIFIC BACKSIDE PARTICLE AND CONTAMINATION REMOVAL

(75) Inventors: David J. Hemker, San Jose, CA (US); John M. Boyd, Atascadero, CA (US)

(73) Assignee: Lam Research Corporation, Fremont, CA (US)

( * ) Notice: Subject to any disclaimer, the term of this patent is extended or adjusted under 35 U.S.C. 154(b) by 229 days.

(21) Appl. No.: 10/029,520

(22) Filed: Dec. 21, 2001

(51) Int. Cl.
*B08B 7/00* (2006.01)
*B08B 7/04* (2006.01)

(52) U.S. Cl. ............... 134/18; 134/1; 134/1.3; 134/113; 134/57 R; 134/902

(58) Field of Classification Search ............ 134/18, 134/1, 1.3, 902, 113, 201, 115 R, 184, 57 R; 438/906; 219/121.62, 121.85
See application file for complete search history.

(56) References Cited

U.S. PATENT DOCUMENTS

| | | | | |
|---|---|---|---|---|
| 5,865,901 A | * | 2/1999 | Yin et al. | 134/2 |
| 5,963,315 A | * | 10/1999 | Hiatt et al. | 356/237.3 |
| 6,394,105 B1 | * | 5/2002 | Boszormenyi et al. | 134/1.3 |

* cited by examiner

*Primary Examiner*—Alexander Markoff
(74) *Attorney, Agent, or Firm*—Martine Penilla & Gencarella, LLP

(57) ABSTRACT

An invention is disclosed for backside particle removal during a semiconductor manufacturing process. Cleaning sites are defined on the backside of a wafer. The cleaning sites are regions of the backside of the wafer that physically contact a chuck during a semiconductor fabrication process. Once the cleaning sites are defined, the backside of the wafer is cleaned, where the cleaning is primarily directed to the cleaning sites. Typically, the contact regions can correspond to pin positions of a chuck pin array, or wafer contact areas on a vacuum chuck. A laser or a megasonic wand can be used to provide the site-specific cleaning of the wafer backside.

14 Claims, 8 Drawing Sheets

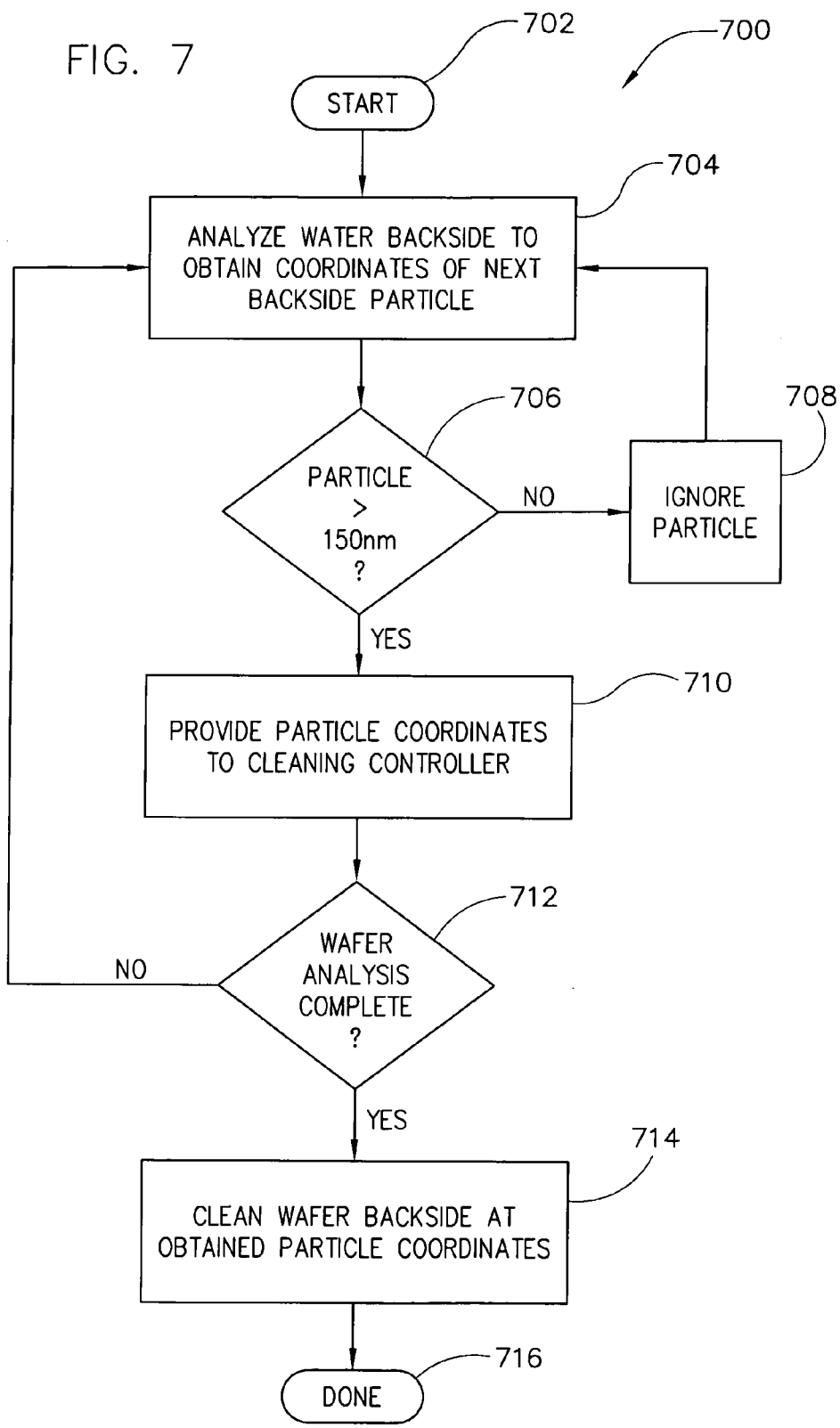

METHOD FOR PERFORMING SITE-SPECIFIC BACKSIDE PARTICLE AND CONTAMINATION REMOVAL

BACKGROUND OF THE INVENTION

1. Field of the Invention

This invention relates generally to wafer cleaning in a semiconductor manufacturing process, and more particularly to site-specific wafer backside particle and contamination removal prior to a lithographic process.

2. Description of the Related Art

During semiconductor fabrication, wafers are processed via a plurality of processing modules that create the various dielectric and metal layers that comprise the semiconductor devices. To ensure proper processing, the wafers generally are cleaned at various points during the manufacturing process to remove particles that may affect the device fabrication. One such cleaning operation typically is performed prior to the lithography process.

Lithography is a well known field and includes both electron beam and photolithography. A typical application of lithography is for defining patterns onto photo or electron sensitive resist that is coated on a substrate, which typically is a semiconductor wafer or a reticle blank for semiconductor fabrication. The lithography process defines a pattern on the resist that is then developed and used for subsequent etching or other steps.

FIG. 1A is a diagram showing a prior art lithography system 100. The lithography system 100 includes a lithography tool 102, which exposes photo resist on the surface of a wafer 104. Generally, the wafer 104 is held in place during the lithography processing using a chuck 106 having, in this example, a plurality of pins 108 that support the wafer 104.

In operation, the lithography tool 102 includes a reticle (mask) in which a beam of light is directed through a mask to image a pattern onto the photo resist of the wafer 104. In addition, a beam can be directed in a raster or vector scan onto the resist of the wafer 104. The scanned beam is turned on and off in order to expose or not expose various portions of the resist. In lithography an important goal is uniformity of each instance of an identical feature defined by the lithography process. The features are the elements imaged onto the substrate. There can be systematic variations in feature sizes that are determined by the feature's location on the substrate and which arise from a variety of causes.

Unfortunately, problem 'hot spots' can occur during critical lithographic process steps, which can cause the entire wafer 104 to require reworking. Hot spots occur when particles 110 on the backside of the wafer 104 effectively shift the wafer 104 up locally, causing local depth of focus problems, as described in greater detail subsequently with reference to FIG. 1B. In particular, particles having a size greater than about 150 nm can cause local shifts of sufficient size to create local depth of focus problems. The severity of local shift problems often depends on the wafer location where the local shift occurs.

FIG. 1B is a diagram showing an exemplary depth of focus range 150 for a conventional lithography process. The depth of focus range 150 is the range within which the lithography tool 102 can properly expose the resist on the surface of the wafer 104. As shown in FIG. 1B, the surface of the wafer 104 varies, depending on the structures being fabricated on the wafer 104. As a result, the severity of local shift problems often depends on the wafer location where the local shift occurs. For example, when a particle is located on the backside of the wafer 104 below point 152, point 152 could be shifted up to point 152'. Since point 152' is still located within the depth of focus range 150, the affect from the hot spot generally will be relatively small.

However, when a particle is located on the backside of the wafer 104 below point 154, which is located on a higher point of the wafer 104 than point 152, point 154 could be shifted up to point 154'. Since point 154' is located outside the depth of focus range 150, the affect from the hot spot can cause exposure errors which will require the wafer 104 to be reworked. In particular, when the resist is shifted outside the depth of focus range 150 underexposure and overexposure of the resist can occur, as described below with reference to FIGS. 2A and 2B.

FIG. 2A is a diagram showing an underexposed resist layer 200. After development, the resist mask in the example of FIG. 2A should have a pattern as defined by resist pattern 202. However, because of a shift outside the depth of focus for the lithography tool, the resist mask includes an underexposed resist portion 204. As will be apparent to those skilled in the art, the underexposed resist portion 204 can prevent areas below the underexposed resist portion 204 in the underlying layer 206 from being etched, and a change in critical dimension of the feature being defined by the lithography process. As a result, the etch pattern will be incorrect, causing the device to function improperly. An incorrect etch pattern can also result from overexposure of the resist, as described next with reference to FIG. 2B.

FIG. 2B is a diagram showing an over exposed resist layer 250. As with FIG. 2A, after development the resist mask in the example of FIG. 2B should have a pattern as defined by resist pattern 202. However, because of a shift outside the depth of focus for the lithography tool, the resist mask can include bowed resist portions. For example, overexposure can bow the resist pattern 202, causing the resist pattern to comprise both sections 202 and bowed sections 252. As will be apparent to those skilled in the art, the overexpose resist comprising sections 202 and sections 252 can adversely affect areas below the overexposed bowed resist portion 252 in the underlying layer 206 from during etch. As a result, the etch pattern will be incorrect, causing the device to function improperly.

Etch errors typically are discovered during critical dimension checks where the critical dimensions of the wafer features are checked. When the errors are discovered the wafer must be reworked. Reworking requires the wafer to be removed, cleaned, recoated, baked, and re-patterned using the lithography tool. It is not unusual for conventional lithography systems to require from about 10%–20% rework without effective wafer backside cleaning prior to lithography processing, and maintenance of the cleanliness between the cleaning step and the lithography step.

In view of the foregoing, there is a need for backside cleaning methods that remove backside particles and contamination prior to a lithographic process. The methods should provide efficient and effective backside cleaning without requiring undue cost and time to perform.

SUMMARY OF THE INVENTION

Broadly speaking, embodiments of the present invention fill these needs by providing a site-specific cleaning method for wafer backside particle and contamination removal. Embodiments of the present invention primarily direct cleaning operations to critical regions of the wafer backside that make physical contact with the wafer processing chuck. In one embodiment, a method for backside particle removal during a semiconductor manufacturing process is disclosed.

Cleaning sites are defined on the backside of a wafer. The cleaning sites are regions of the backside of the wafer that physically contact a chuck during a semiconductor fabrication process. Once the cleaning sites are defined, the backside of the wafer is cleaned, where the cleaning is primarily directed to the cleaning sites. In aspect, the cleaning sites can be aligned with the contact regions of the chuck. The contact regions are regions of the chuck that physically contact the backside of the wafer during the semiconductor fabrication process. Typically, the contact regions can correspond to pin positions of a chuck pin array, or wafer contact areas on a vacuum chuck. In addition, the contact regions can be pre-programmed into a cleaning controller. In a further aspect, a laser or a megasonic wand can be used to provide the site-specific cleaning of the wafer backside.

In a further embodiment, a system is disclosed for backside particle removal during a semiconductor manufacturing process. The system includes a chuck and a cleaning controller that defines cleaning sites on a backside of a wafer. As above, the cleaning sites are regions of the backside of the wafer that physically contact the chuck during a semiconductor fabrication process. The system also includes a site specific cleaning apparatus that is capable of cleaning the backside of the wafer. As above, the cleaning is primarily directed to the cleaning sites. In one aspect, the system can include a wafer aligning apparatus that aligns the cleaning sites with contact regions of the chuck.

A further method for backside particle removal during a semiconductor manufacturing process is disclosed in a further embodiment of the present invention. In this embodiment, the backside of the wafer is analyzed to obtain coordinates of specific particles located on the backside of the wafer. The backside of the wafer is cleaned, wherein the cleaning is primarily directed to the obtained coordinates of the specific particles. In one aspect, the specific particles have a size greater than about 150 nm. Also, the obtained coordinates can be provided to a cleaning controller that directs a site specific cleaning apparatus, which can be a laser or a megasonic wand, to clean the backside of the wafer at the obtained coordinates. Further, the cleaning can be primarily directed to regions of the backside of the wafer that physically contact the chuck during a semiconductor fabrication process, in addition to specific particles. In this manner, the cleaning process is further refined. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 7 is a flowchart showing a method for backside particle removal during a semiconductor manufacturing process using particle analysis, in accordance with an embodiment of the present invention.

DETAILED DESCRIPTION OF THE PREFERRED EMBODIMENTS

An invention is disclosed for a site-specific cleaning method for wafer backside particle and contamination removal. Embodiments of the present invention primarily direct cleaning operations to critical regions of the wafer backside that make physical contact with the wafer processing chuck, such as litho chuck. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Although the embodiments of the present invention will be described in terms of lithographic processing, it should be noted that the embodiments of the present invention can be utilized in any wafer fabrication process requiring wafer support from the backside of a wafer. For example, embodiments of the present invention can be utilized prior to an etch process to ensure proper wafer backside support.

Figure 1A:
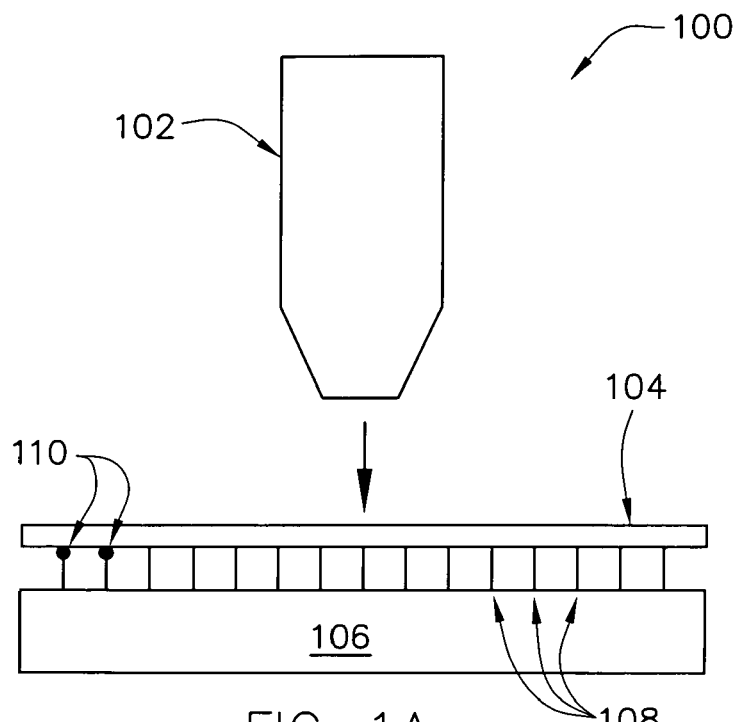
FIG. 1A is a diagram showing a prior art lithography system.
Figure 1B:
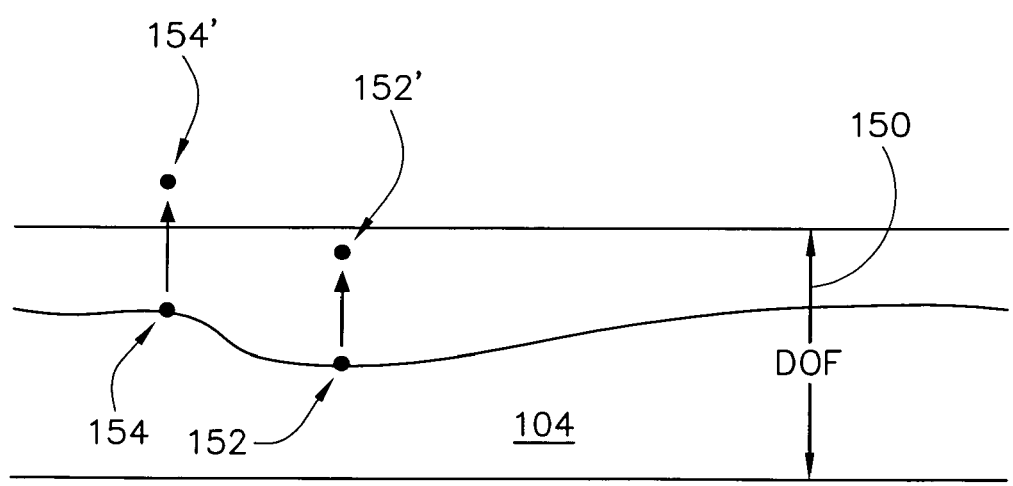
FIG. 1B is a diagram showing an exemplary depth of focus range for a conventional lithography process.
Figure 2A:
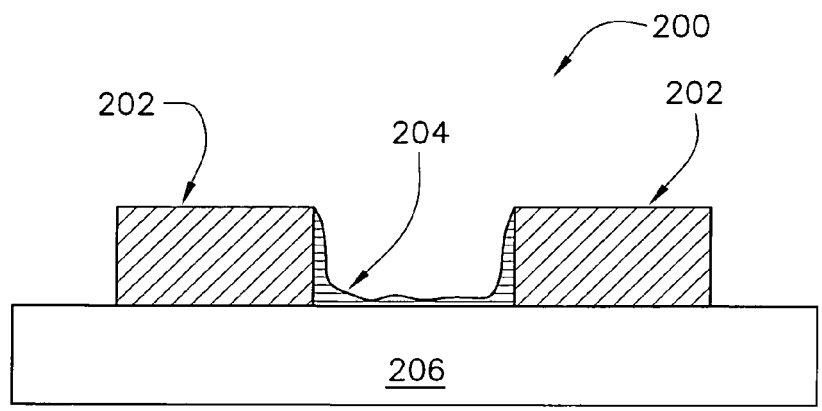
FIG. 2A is a diagram showing an underexposed resist layer.
Figure 2B:
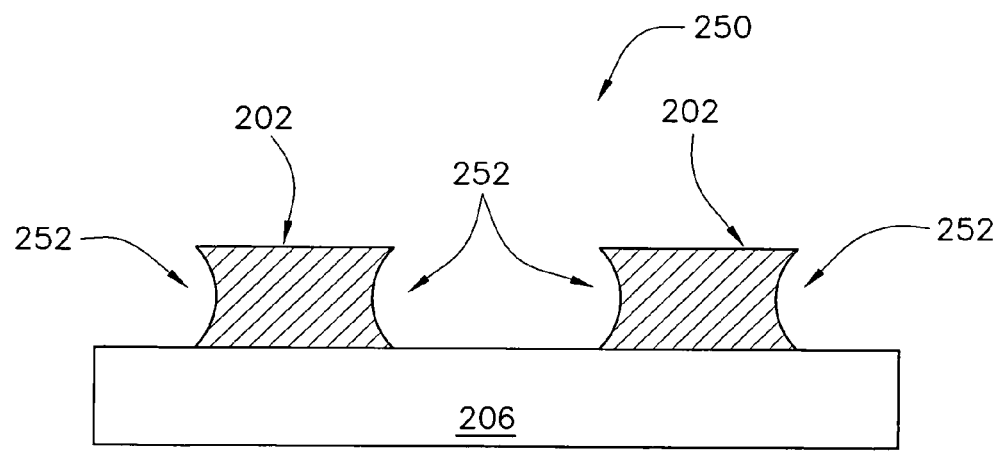
FIG. 2B is a diagram showing an over exposed resist layer.
Figure 3A:
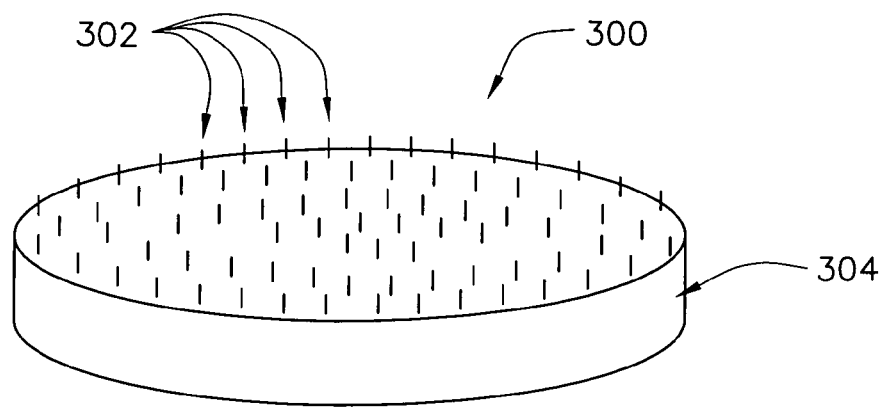
FIG. 3A is a diagram showing a pin chuck.

FIGS. 1A, 1B, 2A, and 2B have been described in terms of the prior art. FIG. 3A is a diagram showing a pin chuck 300. In the field of lithographic processing, a variety of wafer chuck designs can be utilized to support the wafer during lithographic exposure. One wafer chuck design utilized during lithographic processing is the pin chuck 300, shown in FIG. 3A. The pin chuck 300 includes a pin array, which comprises a plurality of concentrically arranged pins 302, typically comprised on a low-expansion ceramic material, such as Zerodur. The pins 302 are a fixed height and generally supported in a stainless steel plate 304. The pins 302 are co-planar and protrude approximately 1 mm above the plate 304. Typically, each pin 302 has a diameter of approximately 1–1.5 mm.

Wafer leveling is achieved by moving the plate 304, which is supporting the pins 302. The surface of each pin 302 is flat, and generally requires regular cleaning using specialized effectors to maintain control of the lithography process, in addition to a backside and edge cleaning process step performed prior to wafer queue for lithography. Prior to lithographic processing, wafers typically are transferred from a cleaner to a cassette while waiting for the lithographic process. It is during this queue that a potential for re-introducing particles to the wafer backside occurs from the cassette. As mentioned previously, the re-introducing particles can lead to lithography process problems and resultant rework of the affected wafers. Hence, when wafers are free of backside particles, significant reductions in wafer rework can be achieved.

Many cleaning technologies for wafer backside cleaning are under investigation and development. However, these technologies generally involve non site-specific methods, such as double-side scrubbing, megasonic baths, and single/batch spray processors. One emerging cleaning technology involves laser cleaning of the wafer surface. However the actual cleaning spot size of the laser is small relative to the wafer surface, thus requiring the laser to raster scan the surface for blanket cleaning which reduces throughput and dramatically increases costs.

To address this issue embodiments of the present invention utilize a site-specific cleaning apparatus, such as a laser, to clean specific cleaning sites on the backside of the wafer. In one embodiment, the cleaning sites are regions of the backside of the wafer that physically contact the chuck during a semiconductor fabrication process, such as during lithographic processing.

Figure 3B:
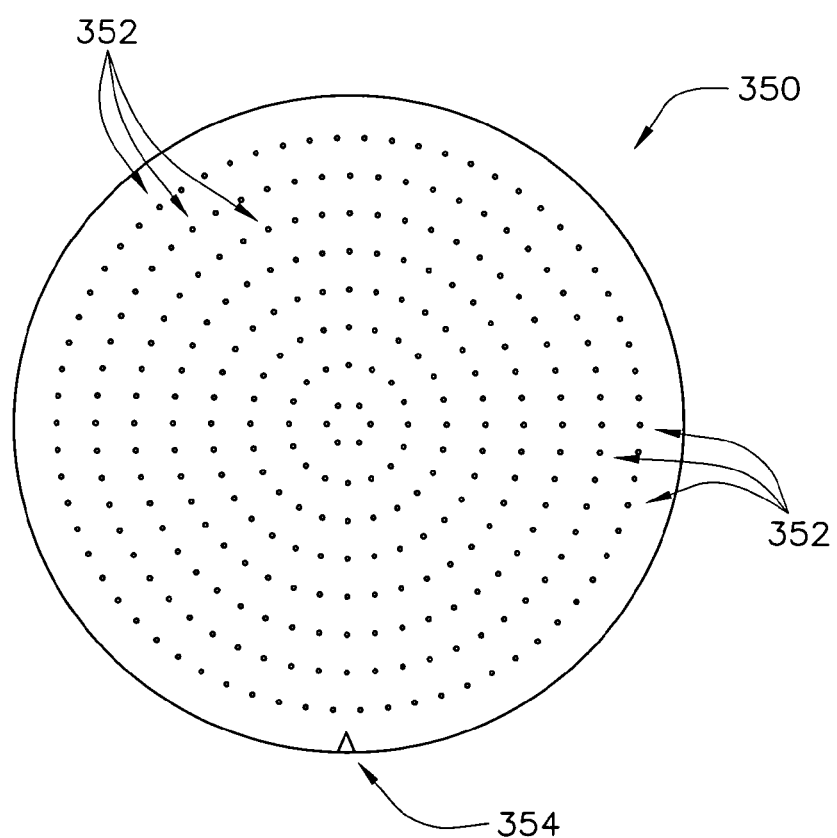
FIG. 3B is a diagram showing a wafer backside having defined cleaning sites, in accordance with an embodiment of the present invention.

FIG. 3B is a diagram showing a wafer backside 350 having defined cleaning sites, in accordance with an embodiment of the present invention. As mentioned above, embodiments of the present invention primarily direct cleaning operations to critical regions of the wafer backside that make physical contact with the wafer processing chuck. FIG. 3B shows predefined cleaning sites 352 on the wafer backside 350. In particular, the predefined cleaning sites 352 correspond to the locations of the pins 302 on the pin chuck 300 of FIG. 3A.

During a lithographic process, the wafer is supported on the tops of the pins 302 of the pin chuck 300. Thus, the only regions of the pin chuck 300 that physically contact the wafer during a lithographic process are the tops of the pins 302. As a result, only particles located on the backside of the wafer that will contact the tops of pins 302 can potentially affect the lithographic process.

Thus, in the embodiment of FIG. 3B, cleaning sites 352 are defined that correspond to the locations of the pins 302 on the pin chuck. Then, a laser is utilized to clean the defined cleaning sites 352. Since the laser is utilized for site-specific cleaning of the cleaning sites 352, rather than blanket cleaning the entire backside of the wafer, throughput is improved and cost is kept low.

Once the cleaning sites 352 have been cleaned using the laser, the wafer is aligned with the chuck 300 using an alignment notch 354. Because particles have been removed from the regions of the wafer backside that will physically contact the pin-chuck 300, backside particle induced depth of focus problems will not occur, regardless of particles located on the wafer backside outside the cleaning sites 352.

In one embodiment, a cleaning controller can be programmed to define the cleaning sites 352. In this embodiment, the pin configuration of the pin chuck is preprogrammed into the cleaning controller. The cleaning controller can then provide cleaning site coordinates to the laser, which directs laser energy to the cleaning sites to remove wafer backside particles. In addition to a laser, embodiments of the present invention can utilize a megasonic wand to direct megasonic energy to the cleaning sites 352 on the backside of the wafer. Although some embodiments of the present invention direct laser and/or megasonic energy only to the cleaning sites 352, it should be noted that embodiments of the present invention can also clean areas outside the cleaning sites 352. For example, embodiments of the present invention can clean areas that are slightly larger than the cleaning sites, or include areas that will contact a subsequent wafer chuck later in the fabrication process.

Figure 4A:
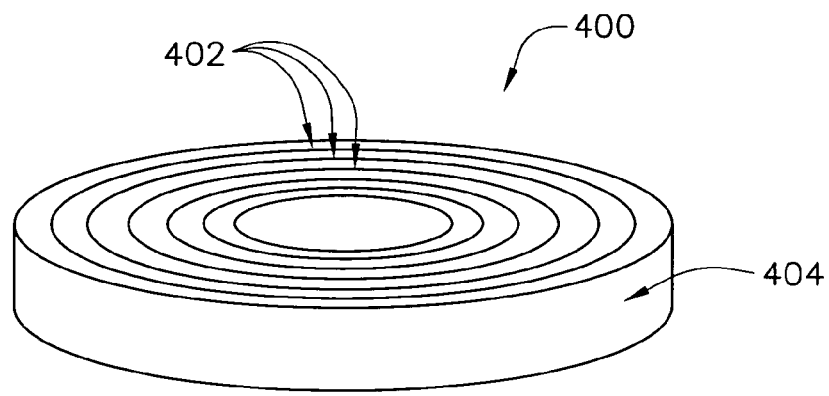
FIG. 4A is a diagram showing a vacuum chuck.

As mentioned previously a variety of wafer chuck designs can be used in a lithographic process. Another wafer chuck design is a vacuum chuck, as described next with reference to FIG. 4A. FIG. 4A is a diagram showing a vacuum chuck 400. The vacuum chuck 400 includes a plurality of concentric vacuum grooves 402 located within a flat plate 404. The vacuum grooves 402 are utilized to apply a vacuum to the wafer backside, which holds the wafer flat during the lithography process. As with the pin chuck described above with reference to FIG. 3A, wafer leveling using the vacuum chuck 400 is achieved by moving the plate 404. Also as above, wafers typically are transferred from a cleaner to a cassette while waiting for the lithographic process.

Figure 4B:
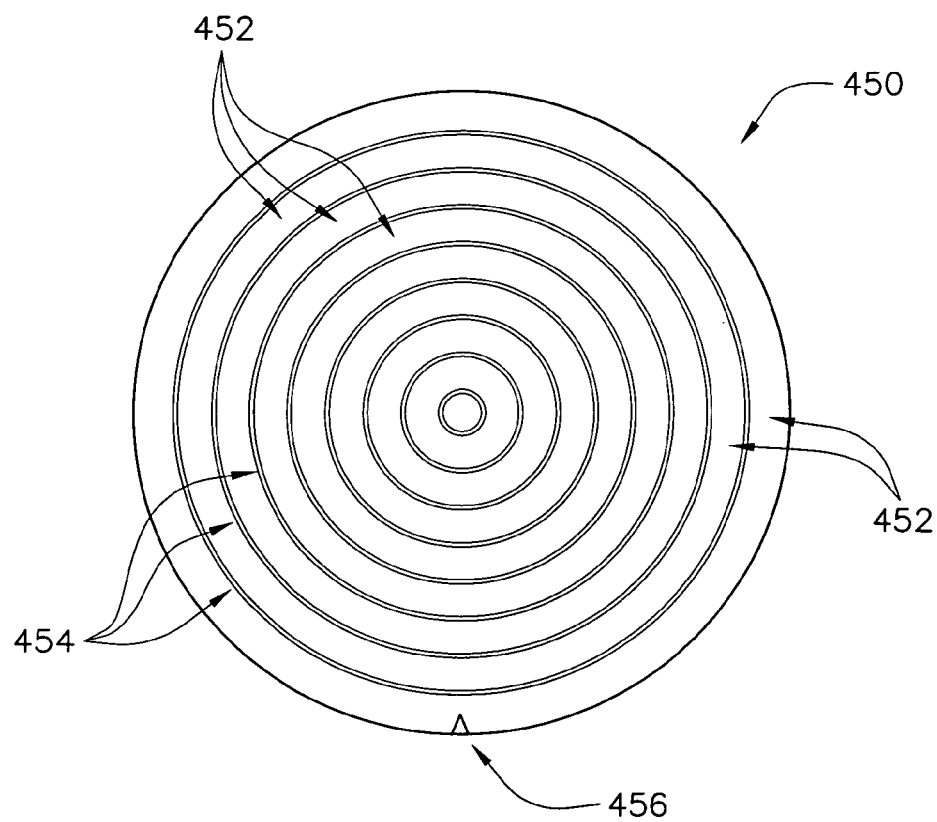
FIG. 4B is a diagram showing a wafer backside having defined cleaning sites, in accordance with an embodiment of the present invention.

FIG. 4B is a diagram showing a wafer backside 450 having defined cleaning sites, in accordance with an embodiment of the present invention. As mentioned above, embodiments of the present invention primarily direct cleaning operations to critical regions of the wafer backside that make physical contact with the wafer processing chuck. FIG. 4B shows predefined cleaning sites 452 on the wafer backside 450. In particular, the predefined cleaning sites 452 correspond to the regions of the vacuum chuck 400 outside the vacuum grooves 402. Hence, embodiments of the present invention can ignore the regions 454 on the backside of the wafer that correspond to the vacuum grooves 402 of the vacuum chuck 400 because these regions 454 of the wafer backside will not physically contact the chuck.

In particular, during a lithographic process, the wafer is supported by the plate 404 and a vacuum is applied to the wafer backside using the vacuum grooves 402. Thus, the only regions of the vacuum chuck 400 that physically contact the wafer during a lithographic process are the regions of the chuck plate 404 outside the vacuum grooves 402. As a result, only particles located on the backside of the wafer that will contact the regions of the plate 404 outside the vacuum grooves 402 can potentially affect the lithographic process.

Thus, in the embodiment of FIG. 4B, cleaning sites 452 are defined that correspond to the locations of the plate 404 outside the vacuum grooves 402. Then, a laser, megasonic wand, or any other cleaning apparatus capable of site-specific cleaning can be utilized to clean the defined cleaning sites 452. Since the laser is utilized for site-specific cleaning of the cleaning sites 452, rather than blanket cleaning the entire backside of the wafer, throughput is improved and cost is kept low.

Once the cleaning sites 452 have been cleaned using the laser, or megasonic wand, the wafer is aligned with the chuck 400 using an alignment notch 456. Because particles have been removed from the regions of the wafer backside that will physically contact the vacuum chuck 400, backside particle induced depth of focus problems will not occur, regardless of particles located on the wafer backside outside the cleaning sites 452. Embodiments of the present invention can be implemented as standalone cleaners or integrated into a lithographic system, as described next with reference to FIGS. 5A and 5B.

Figure 5A:
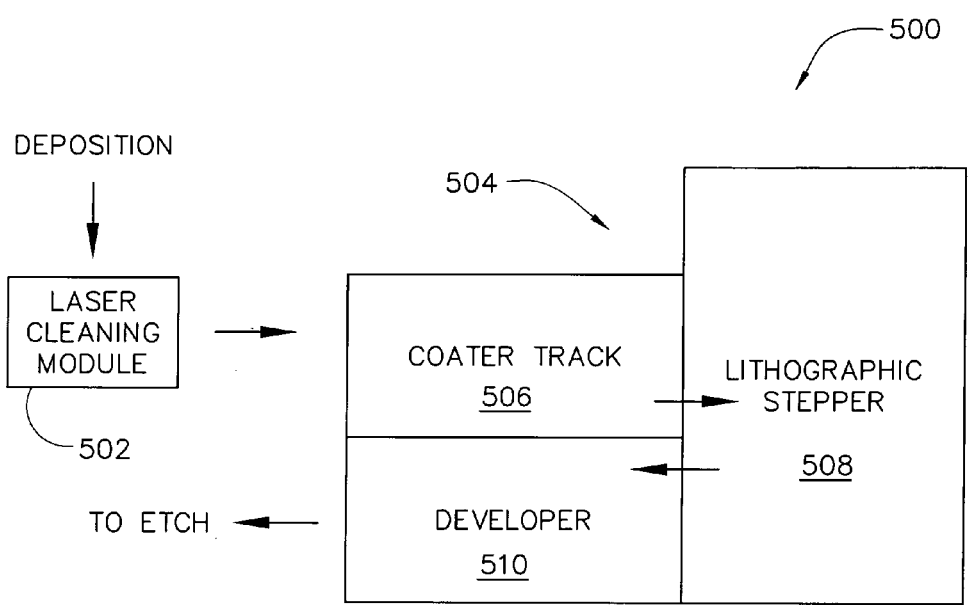
FIG. 5A is a diagram showing a lithographic system having a site-specific wafer backside cleaning, in accordance with an embodiment of the present invention.

FIG. 5A is a diagram showing a lithographic system 500 having a site-specific wafer backside cleaning, in accordance with an embodiment of the present invention. The lithographic system 500 includes a laser cleaning module 502, which transfers cleaned wafers to a coater track 506.

The coater track 506 is integrated with a lithographic stepper 508 and a developer 510, which provides resist patterned wafers to an etch system.

In operation, the laser cleaning module 502 receives the wafer from the deposition process. As mentioned above, embodiments of the present invention primarily direct cleaning operations to critical regions of the wafer backside that make physical contact with the wafer processing chuck. Hence, if the lithographic stepper utilizes a pin chuck, the laser cleaning module 502 defines cleaning sites on the backside of the wafer that correspond to the locations of the pins on the pin chuck. Then, a laser is utilized to clean the defined cleaning sites.

In one embodiment, a cleaning controller can be programmed to define the cleaning sites. In this embodiment, the configuration of the chuck is preprogrammed into the cleaning controller. The cleaning controller can then provide cleaning site coordinates to the laser, which directs laser energy to the cleaning sites to remove wafer backside particles. As mentioned previously, in addition to a laser, embodiments of the present invention can utilize a megasonic wand to direct megasonic energy to the cleaning sites on the backside of the wafer.

Figure 6A:
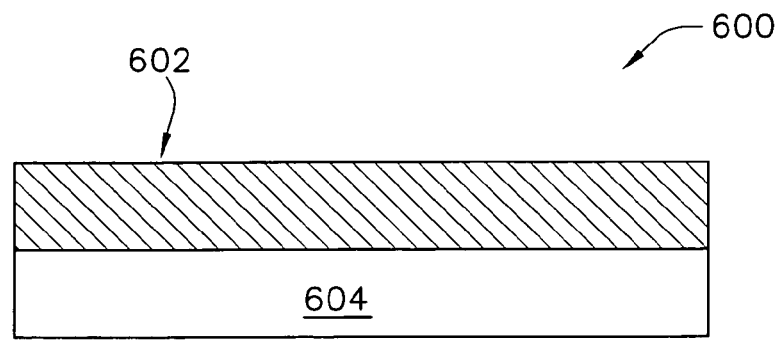
FIG. 6A is a diagram showing resist coated wafer section.

The wafer is then transferred to the coater track 506, which coats the top surface of the wafer with resist, as described next with reference to FIG. 6A. FIG. 6A is a diagram showing resist coated wafer section 600. As shown in FIG. 6A, a top layer 604 of the wafer is coated with a layer of unexposed resist 602. The unexposed resist 602 is utilized during a subsequent etch process to pattern the top layer 604 in a predefined manner.

Referring back to FIG. 5A, after applying a coat of resist to the top layer of the wafer, the coater track 502 transfers the wafer to the lithographic stepper 508, which exposes the resist in a particular pattern. As mentioned above, the backside of the wafer is cleaned at specific cleaning sites have using the laser of the laser cleaning module 502. These cleaning sites are then aligned with the contact regions of the wafer chuck, such as the pins of a pin chuck, using an alignment notch on the edge of the wafer. Because particles have been removed from the regions of the wafer backside that will physically contact the chuck, backside particle induced depth of focus problems will not occur, regardless of particles located on the wafer backside outside the cleaning sites.

Figure 6B:
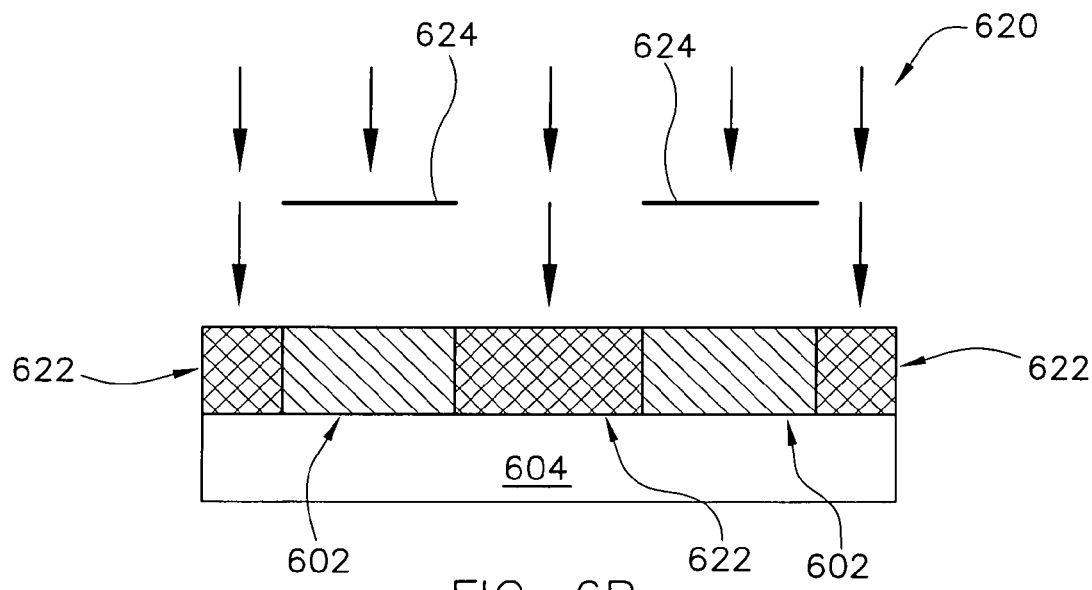
FIG. 6B is a diagram showing an exposed resist coated wafer section.

FIG. 6B is a diagram showing an exposed resist coated wafer section 620. As shown in FIG. 6B, the lithography tool generally includes a recticle 624, which forms a mask having a particular pattern. The recticle 624 is utilized to image a pattern onto the unexposed resist 602. More particularly, areas of unexposed resist 602 blocked the recticle 624 remain unexposed. However, areas of resist that are not blocked by the recitcle 624 become exposed resist 622 portions. Depending on the particular type of lithography be performed, either the exposed resist 622 or the unexposed resist 602 will remain after resist development, as described subsequently with respect to FIG. 6C.

Figure 6C:
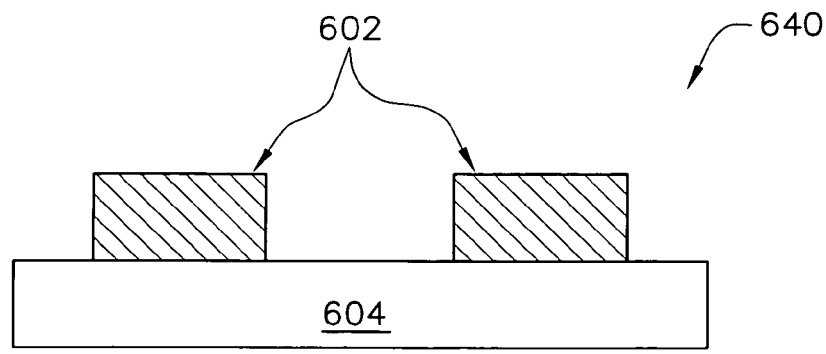
FIG. 6C is a diagram showing a pattern resist coated wafer section.

Referring back to FIG. 5A, once the lithographic stepper 508 has exposed the resist in a particular pattern, the lithographic stepper 508 transfers the wafer to the developer 510. The developer 510 develops the exposed resist to form the resist mask on the surface of the wafer, as described next with reference to FIG. 6C. FIG. 6C is a diagram showing a pattern resist coated wafer section 640. As mentioned above, depending on the particular type of lithography be performed, either the exposed resist or the unexposed resist will remain after resist development. In the example of FIG. 6C, the expose resist is removed during development, leaving only the unexposed resist 602 to from a resist mask on the top layer 604 of the wafer.

Thereafter, the wafer is provided to an etch system for etching of the top layer of the wafer. In this manner, the etch process will only removed areas of the top layer that are not covered by the patterned resist mask layer. The resist mask can then be removed after etch to allow further processing of the wafer.

Figure 5B:
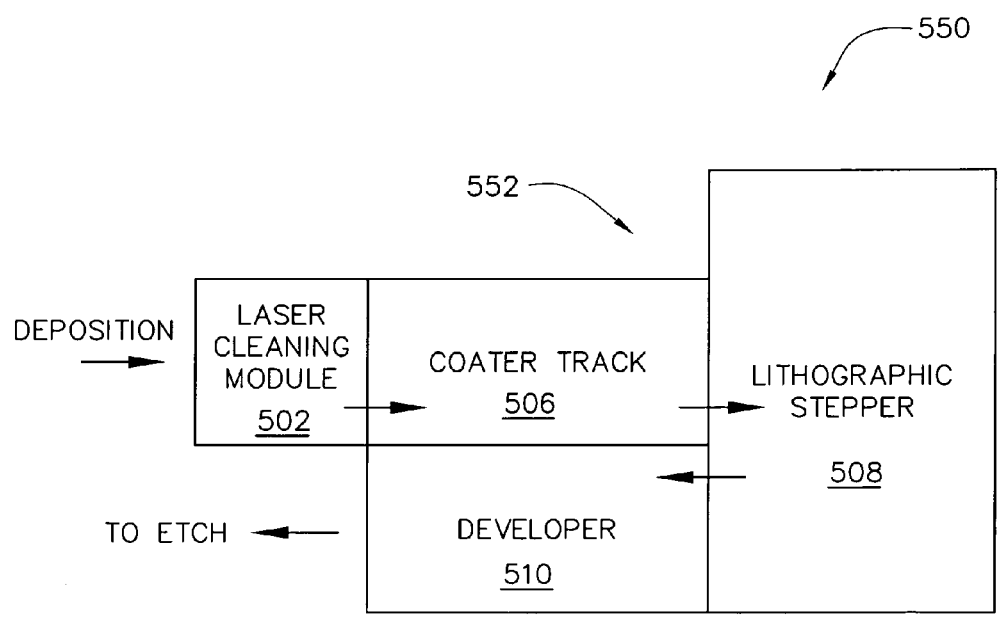
FIG. 5B is a diagram showing a lithographic system having integrated site-specific wafer backside cleaning, in accordance with an embodiment of the present invention.

To increase throughput and reduce particle contamination during transport, embodiments of the present invention can integrate the laser cleaning module with the lithography system, as described next with reference to FIG. 5B. FIG. 5B is a diagram showing a lithographic system 550 having integrated site-specific wafer backside cleaning, in accordance with an embodiment of the present invention. In the lithographic system 550 shown in FIG. 5B, the laser cleaning module 502 is fully integrated with the remainder of the lithography system. That is, the laser cleaning module 502 is integrated with the coater track 506, the lithographic stepper 508, and the developer 510.

The integrated laser cleaning module 502 of FIG. 5B avoids wafers being transferred from the laser cleaning module 502 to a cassette while waiting for the lithographic process. Since it is during this queue that a potential for re-introducing particles to the wafer backside occurs from the cassette, the integrated laser cleaning module 502 can greatly reduce the re-introducing of particles to the wafer backside. Thus avoiding lithography process problems and resultant rework of the affected wafers. In addition, embodiments of the present invention can utilize a particle scan to determine cleaning site coordinates, as described next with reference to FIG. 7.

FIG. 7 is a flowchart showing a method 700 for backside particle removal during a semiconductor manufacturing process using particle analysis, in accordance with an embodiment of the present invention. In an initial operation 702 preprocess operations are performed. Preprocess operations can include deposition, inter process module wafer transport, and other preprocess operations that will be apparent to those skilled in the art.

In operation 704, the wafer backside is analyzed to obtain coordinates of the next backside particle. A particle scan can be performed on the backside of the wafer using a particle detection system. When a particle is detected, its coordinates relative to the wafer backside are determined. As will be described in greater detail below, the particle may be cleaned or may be ignored depending on its potential affect on the lithography process.

A decision is then made as to whether the particle is greater than about 150 mm, in operation 706. In 130 nm technology, particles having a size greater than about 150 mm have a potential for adversely affecting the lithography process, as described previously. However, particles having a size less than about 150 mm generally will not affect the lithography process and can be ignored. Although the above description is in terms of 130 nm technology, embodiments of the present invention can also be utilized with smaller scale technology or larger scale technology. When using technology smaller than 130 nm, particles having a size less than 150 mm can affect the lithography process. As such, when using such technology a threshold value less than 150 mm can be used in operation 706. In a similar manner, a threshold value larger than 150 mm can be used in operation 706 when using larger scale technology. If the particle is greater than about 150 mm, the method 700 continues to operation 706. Otherwise, the method 700 branches to operation 708.

In operation 708, the detected particle is ignored. As mentioned above, particles having a size less than about 150 mm generally will not affect the lithography process and can be ignored. Hence, the method 700 ignores the particle and continues with another operation 704 to detect the next backside wafer particle.

The particle coordinates are provided to the cleaning controller, in operation 710. Particles having a size greater than about 150 mm have a potential for adversely affecting the lithography process, as described previously. Hence, embodiments of the present invention provide these coordinates to the cleaning controller, which will later direct the site-specific cleaning apparatus, as described subsequently.

A decision is then made as to whether the wafer analysis is complete, in operation 712. The wafer analysis continues in a manner as described above until the backside of the wafer has been completed analyzed by the particle detection system. If the wafer analysis not yet complete, the method 700 continues with another operation 704 to obtain the coordinates of the next backside particle. Otherwise, the method 700 continues with operation 714.

In operation 714, the wafer backside is cleaned at the coordinates obtained and provided to the cleaning controller. At this point, the cleaning controller includes the coordinates to all backside particles that can potentially affect the lithography process. Hence, these coordinates are used to direct a site-specific cleaning apparatus, such as a laser, to clean the wafer backside at the obtained coordinates. As a result, all particles that can potentially affect the lithography process are removed from the backside of the wafer.

Post process operations are performed in operation 716. Post process operations can include resist coating, lithographic exposure, resist development, and other post process operations that will be apparent to those skilled in the art. Advantageously, embodiments of the present invention can remove only those particles that can affect fabrication process, while ignoring other particles. As result, throughput can be improved and cost kept low. In a further embodiment, cleaning can be further limited to regions on the backside of the wafer that physically contact the chuck during processing. In this embodiment, only coordinates of particles that are both large enough to affect the lithography process and that are within the regions of the wafer that physically contact the chuck will be provided to the cleaning controller.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method for backside particle removal, comprising the operations of:
   identifying contact sites on a backside of a wafer, wherein the contact sites are portions of the backside of the wafer that physically contact a surface of a chuck having a predefined shape, the physical contact occurring when the backside of the wafer is placed in physical contact with the predefined shape of the surface during a semiconductor fabrication process; and
   cleaning the contact sites on the backside of the wafer, the cleaning omitting cleaning of the portions of the backside of the wafer not having physical contact with the predefined shape of the surface of the chuck during the semiconductor fabrication process.

2. A method as recited in claim 1, further comprising the operation of aligning the contact sites with the predefined shape of the surface of the chuck after the cleaning of the contact sites in preparation for the semiconductor fabrication process, wherein the predefined shape of the surface of the chuck physically contacts the backside of the wafer during the semiconductor fabrication process.

3. A method as recited in claim 2, wherein the chuck includes a chuck pin array, wherein the contact regions correspond to pin positions of the chuck pin array.

4. A method as recited in claim 2, wherein the chuck is a vacuum chuck, and the contact regions correspond to wafer contact areas on the vacuum chuck.

5. A method as recited in claim 1, further comprising the operation of pre-programming the contact sites into a cleaning controller.

6. A method as recited in claim 1, wherein a laser is utilized to clean the contact sites on the backside of the wafer.

7. A method as recited in claim 1, wherein a megasonic wand is utilized to clean the contact sites on the backside of the wafer.

8. A system for backside particle removal, comprising:
   a cleaning controller programmed to identify contact sites on a backside of a wafer, wherein the contact sites are portions of the backside of the wafer that physically contact a surface of a chuck having a predefined shape, the physical contact occurring when the backside of the wafer is placed in physical contact with the predefined shape of the surface during a semiconductor fabrication process and programmed to omit cleaning portions of the backside of the wafer not having physical contact with the predefined shape of the surface of the chuck during the semiconductor fabrication process; and
   a site specific cleaning apparatus controlled by the cleaning controller to clean the contact sites on the backside of the wafer defined by the cleaning controller, where the site specific cleaning apparatus omits cleaning portions of the backside of the wafer not having physical contact with the predefined shape of the surface of the chuck during the semiconductor fabrication process.

9. A system as recited in claim 8, further comprising a wafer aligning apparatus that aligns the contact sites with the predefined shape of the surface of the chuck, wherein the predefined shape of the surface of the chuck that physically contacts the backside of the wafer during the semiconductor fabrication process.

10. A system as recited in claim 9, wherein the chuck includes a pin array that supports the wafer, and wherein the contact sites correspond to pin positions of the pin array.

11. A system as recited in claim 9, wherein the chuck includes grooves for applying a vacuum to the backside of the wafer, and wherein the contact sites correspond to areas of the chuck outside the grooves.

12. A system as recited in claim 8, wherein the site specific cleaning apparatus is integrated with a lithographic stepper apparatus.

13. A system for backside particle removal, comprising:
   a cleaning controller programmed to identify contact sites on a backside of a wafer, wherein the contact sites are portions of the backside of the wafer that physically contact a surface of a chuck having a predefined shape, the physical contact occurring when the backside of the wafer is placed in physical contact with the predefined shape of the surface during a semiconductor fabrication process and programmed to omit cleaning portions of the backside of the wafer not having physical contact with the predefined shape of the surface of the chuck during the semiconductor fabrication process; and a megasonic wand controlled by the cleaning controller to clean the contact sites on the backside of the wafer defined by the cleaning controller, wherein the megasonic wand omits cleaning portions of the backside of the wafer not having physical contact with the predefined shape of the surface of the chuck during the semiconductor fabrication process.

14. A system for backside particle removal, comprising:

a cleaning controller programmed to identify contact sites on a backside of a wafer, wherein the contact sites are portions of the backside of the wafer that physically contact a surface of a chuck having a predefined shape, the physical contact occurring when the backside of the wafer is placed in physical contact with the predefined shape of the surface during a semiconductor fabrication process and programmed to omit cleaning portions of the backside of the wafer not having physical contact with the predefined shape of the surface of the chuck during the semiconductor fabrication process; and a laser controlled by the cleaning controller to clean the contact sites on the backside of the wafer defined by the cleaning controller, wherein the laser omits cleaning portions of the backside of the wafer not having physical contact with the predefined shape of the surface of the chuck during the semiconductor fabrication process.

* * * * *